(12) United States Patent
Finders et al.

(10) Patent No.: US 7,655,368 B2
(45) Date of Patent: Feb. 2, 2010

(54) METHOD FOR EXPOSING A SUBSTRATE AND LITHOGRAPHIC PROJECTION APPARATUS

(75) Inventors: Jozef Maria Finders, Veldhoven (NL); Judocus Marie Dominicus Stoeldraijer, Bladel (NL); Johannes Wilhelmus De Klerk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 765 days.

(21) Appl. No.: 10/936,727

(22) Filed: Sep. 9, 2004

(65) Prior Publication Data

US 2005/0100831 A1    May 12, 2005

(30) Foreign Application Priority Data

Sep. 10, 2003    (EP)    ................... 03255648

(51) Int. Cl.
*G03C 5/00* (2006.01)
*G03F 9/00* (2006.01)

(52) U.S. Cl. .................. 430/30; 430/22; 430/296; 430/311; 430/396; 430/397

(58) Field of Classification Search .................. 430/22, 430/30, 296, 311, 396, 397
See application file for complete search history.

(56) References Cited

U.S. PATENT DOCUMENTS

| 5,333,035 A | 7/1994 | Shiraishi | 355/77 |
| 6,218,077 B1 | 4/2001 | Jin | 430/311 |
| 2003/0059716 A1 | 3/2003 | Simizu | 430/296 |
| 2003/0139054 A1 | 7/2003 | Fujimoto | |

FOREIGN PATENT DOCUMENTS

| EP | 1 248 154 A1 | 10/2002 |
| JP | 04-204737 | 7/1992 |
| JP | 6-029182 | 2/1994 |
| JP | 11-297602 | 10/1999 |
| JP | 2000-077303 | 3/2000 |
| JP | 2001-118784 | 4/2001 |
| JP | 2001-284222 | 10/2001 |
| JP | 2003-209048 | 7/2003 |

OTHER PUBLICATIONS

Australian Search Report issued for Application No. SG 200404944-1, dated Aug. 26, 2005.
Luke Ng, Wenzhan Zhou, "Tool to tool Matching In Photolithography—Process Control of CD and Pitch," Proceedings of SPIE, p. 932-940, ( 2003).
Notice of Reasons for Rejection issued for Japanese Patent Application No. 2004-261770, dated Jun. 9, 2008.
Decision of Dismissal of Amendment issued for Japanese Patent Application No. 2004-261770, dated Jan. 9, 2009.

*Primary Examiner*—Christopher G Young
(74) *Attorney, Agent, or Firm*—Pillsbury Winthrop Shaw Pittman LLP

(57) ABSTRACT

A method for exposing a resist layer on a substrate to an image of a pattern on a mask is disclosed whereby, after starting exposure and before completing exposure, a controlled amount of contrast loss is introduced by a controller in the image at the resist layer by changing during exposure the position of the substrate holder. The contrast loss affects the pitch dependency of the resolution of a lithographic projection apparatus, and its control is used to match pitch dependency of resolution between different lithographic projection apparatus.

29 Claims, 9 Drawing Sheets

METHOD FOR EXPOSING A SUBSTRATE AND LITHOGRAPHIC PROJECTION APPARATUS

CROSS-REFERENCE TO RELATED APPLICATIONS

The present application claims the benefit of priority from European Patent Application No. 03255648.2, filed Sep. 10, 2003, the entire content of which is incorporated herein by reference.

BACKGROUND OF THE INVENTION

1. Field of the Invention

The present invention relates generally to lithographic apparatus and methods for their use.

2. Background of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

The illumination system as well as the projection system generally comprise components for directing, shaping or controlling the projection beam of radiation. Generally, the projection system comprises adjustable elements to set the numerical aperture (commonly referred to as the "NA") of the projection system. For example, an adjustable NA-diaphragm is provided in a pupil of the projection system. The illumination system typically comprises adjustable elements for setting the outer and/or inner radial extent (commonly referred to as σ-outer and σ-inner, respectively) of the intensity distribution upstream of the mask (in a pupil of the illumination system). A specific setting of σ-outer and σ-inner may be referred to hereinafter as an annular illumination mode. Controlling the spatial intensity distribution at a pupil plane of the illumination system can be done to improve the processing parameters when an image of the illuminated object is projected onto a substrate.

Microchip fabrication involves the control of tolerances of a space or a width between devices and interconnecting lines, or between features, and/or between elements of a feature such as, for example, two edges of a feature. In particular the control of space tolerance of the smallest of such spaces permitted in the fabrication of the device or IC layer is of importance. Said smallest space and/or smallest width is referred to as the critical dimension ("CD"). In general, a single substrate will contain a network of adjacent target portions that are successively exposed. Known lithographic apparatus include so-called steppers, in which each target portion is irradiated by exposing an entire pattern onto the target portion in one go, and so-called scanners or step-and-scan apparatus, in which each target portion is irradiated by scanning the pattern through the projection beam in a given direction (the "scanning"-direction) while synchronously scanning the substrate parallel or anti-parallel to this direction.

With conventional projection lithographic techniques it is well known that an occurrence of a variance in CD for isolated features and dense features may limit the process latitude (i.e., the available depth of focus in combination with the allowed amount of residual error in the dose of exposure of irradiated target portions for a given tolerance on CD). This problem arises because features on the mask (also referred to as reticle) having the same nominal critical dimensions will print differently depending on their pitch on the mask (i.e. the separation between adjacent features) due to pitch dependent diffraction effects. For example, a feature consisting of a line having a particular line width when in isolation, i.e. having a large pitch, will print differently from the same feature having the same line width when together with other lines of the same line width in a dense arrangement on the mask, i.e. having small pitch. Hence, when both dense and isolated features of critical dimension are to be printed simultaneously, a pitch dependent variation of printed CD is observed. This phenomenon is called "iso-dense bias", and is a particular problem in photolithographic techniques. Iso-dense bias is measured in nanometer and represents an important metric for practical characterization of lithography processes.

Conventional lithographic apparatuses do not directly address the problem of iso-dense bias. Conventionally, it is the responsibility of the users of conventional lithographic apparatuses to attempt to compensate for the iso-dense bias by either changing the apparatus' optical parameters, such as the numerical aperture of the projection lens or the σ-outer and σ-inner settings, or by designing the mask in a such a way that differences in dimensions of printed isolated and dense features are minimized. This last technique may for example involve reticle oversizing and/or Optical Proximity Correction (referred to hereinafter as OPC). For simplicity, reticles provided with patterns to which any kind of compensation for iso-dense bias has been applied, may be referred to hereinafter as OPC-reticles.

Generally, in a high volume manufacturing site different lithographic projection apparatus are to be used for the same lithographic manufacturing process step to insure optimal exploitation of the machines, and consequently (in view of, for example, machine-to-machine differences) a variance and/or errors in CD may occur in the manufacturing process. Generally, the actual pitch dependency of such errors depends on the specific layout of the pattern and the features, the aberration of the projection system of the lithographic apparatus in use, the properties of the radiation sensitive layer on the substrate, and the radiation beam properties such as illumination settings, and the exposure dose of radiation energy. Therefore, given a pattern to be provided by a patterning device, and to be printed using a specific lithographic projection apparatus including a specific radiation source, one can identify data relating to iso-dense bias which are characteristic for that process, when executed on that lithographic system. Said data, and in particular a listing or plot of CD as a function of pitch for a given apparatus, pattern, and process, is referred to hereinafter, for simplicity, as an "iso-dense bias characteristic". In a situation where different lithographic projection apparatus (of the same type and/or of different types) are to be used for the same lithographic manufacturing process step, there is the problem of mutually matching the corresponding different iso-dense bias characteristics, such as to reduce CD variations occurring in the manufacturing process.

A known technique to match an iso-dense bias characteristic of a machine (for a process whereby an annular illumination mode is used) to an iso-dense bias characteristic of another machine is to change the σ-outer and σ-inner settings, while maintaining the difference between the σ-outer and σ-inner settings (i.e. whilst maintaining the annular ring width of the illumination mode) of one of the two machines. The nominal σ-settings are chosen such as to optimize the process latitude (in particular, the depth of focus and the exposure latitude). Therefore, this approach has the disadvantage that for the machine whereby the σ-settings are changed, the process latitude is becoming smaller and may become too small for practical use.

SUMMARY OF THE INVENTION

One aspect of embodiments of the present invention provides a method for exposing a substrate whereby the iso-dense bias characteristic is modifiable.

This aspect includes embodiments in which a method for exposing a substrate that is at least partially covered by a radiation sensitive layer, uses a lithographic projection apparatus including an illumination system providing a projection beam of radiation, a support structure supporting a patterning device, the patterning device serving to impart the projection beam with a pattern in its cross-section, a substrate table holding a substrate, and a projection system for projecting an image of the pattern onto a target portion of the substrate. The method according to this embodiment includes exposing said radiation sensitive layer to said image, where the exposing includes, after starting exposure and before completing exposure, inducing a loss of contrast for said image, at the target portion, to modify an iso-dense bias characteristic.

The iso-dense bias characteristic for a particular lithographic projection and exposure process step which is part of the manufacturing of an IC device, and which is executed on a particular lithographic projection apparatus, is determined by parameters such as, for example, the shape and distribution of features with a critical dimension in the pattern to be printed, and the illumination settings at which the exposure is executed. The inventors have found that, besides σ-settings, an important parameter affecting an iso-dense bias characteristic is the contrast of an image of the pattern. In particular, the inventors found that a through-pitch effect due to an induced contrast change is different from the through-pitch effect due to a σ-setting change, and that both parameter-changes can be used independently to modify an iso-dense bias characteristic.

The contrast of an image of a feature (or feature edges or a group of features) is often expressed in terms of the normalized image log slope (NILS). The projection system features a notional image surface which typically coincides with a surface (ideally a substantially plane surface) of best focus where image contrast, for example in terms of NILS, is optimal. The value of the NILS of an image relevant for the lithographic process relates to the image of the pattern or part of the pattern, as formed in the resist layer present on the substrate. Generally, during exposure the substrate is positioned such that the resist layer substantially coincides with the notional image surface. When the area of the resist layer within the target portion is displaced away from that image surface, along a Z-direction substantially perpendicular to said notional image surface, the image at the resist layer no longer has optimal NILS, but instead a somewhat decreased NILS. The inventors have found that this decrease of NILS also affects the iso-dense bias characteristic, and that a smooth tuning of an iso-dense bias characteristic can be provided by—after starting exposure and before completing exposure—displacing the Z-position of the substrate such as to provide, upon completion of the exposure, at least some averaging of induced contrast- or NILS-loss.

For both stepper and step-and-scan lithographic projection apparatus, the extra degree of freedom to manipulate an iso-dense bias characteristic can be provided by displacing, during exposure of the target area, the substrate table holding a resist coated substrate in a direction perpendicular to the notional image surface. The displacement can be a continuous movement such as, for example, a vibration, or an intermittent movement, and in case of the use of a pulsed laser as radiation source, the displacement can be done either between the pulses or during exposure to one or more pulses of radiation, or at both instances. For a step-and-scan lithographic projection apparatus, the extra degree of freedom to manipulate an iso-dense bias characteristic according to the invention can be provided by tilting the scanning direction of the substrate table with respect to the notional image surface around an axis parallel to the notional image surface and perpendicular to the scanning direction. Such a tilt has the effect of changing the distance, during scanning and exposure, between an image of a part of the pattern at said notional image surface and a corresponding image at the target portion of the substrate.

According to an aspect of the invention, the additional degree of freedom to modify the iso-dense bias characteristic as provided by the present invention can be used to minimize a difference between an iso-dense bias characteristic and a target iso-dense bias characteristic. In a situation where different lithographic projection apparatus (of the same type and/or of different types) are to be used for the same lithographic manufacturing process step, it is desirable to mutually match the corresponding different iso-dense bias characteristics. This will enable the use of one or more reticles, each having identical patterns and an identical embodiment of optical proximity correction, whereby any of these reticles can be used on any of the different, matched, lithographic projection apparatus. This way of working creates cost savings not only by economizing on expensive OPC-reticles, but also by enabling the use of both high-end and medium- or low-end lithographic apparatus for the same manufacturing process, in case there is no need to run high-end applications on the high-end machines. The target iso-dense bias characteristic in that case can be, for example, the iso-dense bias characteristic typical for the lithographic process when run on one of the low-end machines. The inventors found that the present method provides an improved matching over a large range of pitches of different iso-dense bias characteristics; compared to using σ-settings to induce changes in different iso-dense bias characteristics, the use of controlled contrast loss in images during exposure resulted in a reduction by about a factor three of residual inter-machine iso-dense bias differences.

According to a further aspect of the invention, there is provided a lithographic projection apparatus including an illumination system for providing a projection beam of radiation, a support structure for supporting a patterning device, the patterning device serving to impart the projection beam with a pattern in its cross-section, a substrate table for holding a substrate, and a projection system having a notional image surface, for projecting the patterned beam onto a target portion of the substrate, a memory device for storing data representing a target iso-dense bias characteristic and an iso-dense bias characteristic representative for a process run on the lithographic projection apparatus, and a controller constructed and arranged to determine, based on said data representing an iso-dense bias characteristic and a target iso-dense bias characteristic, one or more apparatus parameter-setting changes comprising at least one of a change of position of the substrate table with respect to said notional image surface, and a change of rotational orientation of the substrate table around an axis substantially parallel to said notional image surface, and to apply said one or more apparatus parameter-setting changes.

According to a further aspect of the invention there is provided a lithographic projection apparatus according as described above, whereby said memory device is arranged for storing data representing a plurality of target iso-dense bias characteristics and an iso-dense bias characteristic representative for a process run on the lithographic projection apparatus, and characterized by further comprising a user interface module adapted and arranged to select one of said plurality of target iso-dense bias characteristics for use with determining said apparatus parameter-setting changes and applying said one or more apparatus parameter-setting changes. For a manufacturing site where different lithographic projection apparatus (for example, of different type and/or of different vendor) are in use, it is possible to identify several different target iso-dense bias characteristics in accordance with different specific lithographic manufacturing process steps (involving a specific pattern, as described above) which are to be run primarily on certain, different machines of first choice. Hence, when another lithographic projection apparatus is equipped with a user interface featuring selectable target iso-dense bias characteristics (that may for example simply be identified by process and apparatus type) a quick setting of apparatus parameters for obtaining an iso-dense bias performance matched to one of said machines of first choice is possible and advantageous.

As mentioned above the notional image surface typically coincides with a plane of best focus. According to the invention, the substrate is exposed to images in planes which are slightly displaced along said Z-direction in order to obtain a modified iso-dense bias characteristic. The images in said slightly displaced planes are slightly "defocused" with respect to the plane of best focus. However, the Z displacements as occurring during the use of the method according to the present invention are of the order of or smaller than a typical depth of focus (DOF) of a lithographic process window. The present invention does not, therefore, address the problem of enhancement of DOF. Typically, the DOF of a lithographic process is of the order of 200 to 300 nm above and below the plane of best focus. The present invention addresses and exploits imaging effects that occur within the DOF range, and it may be sufficient to exploit a range of defocus up to about 50 nm above and below a surface of best focus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning devices, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiment 1

Figure 1:
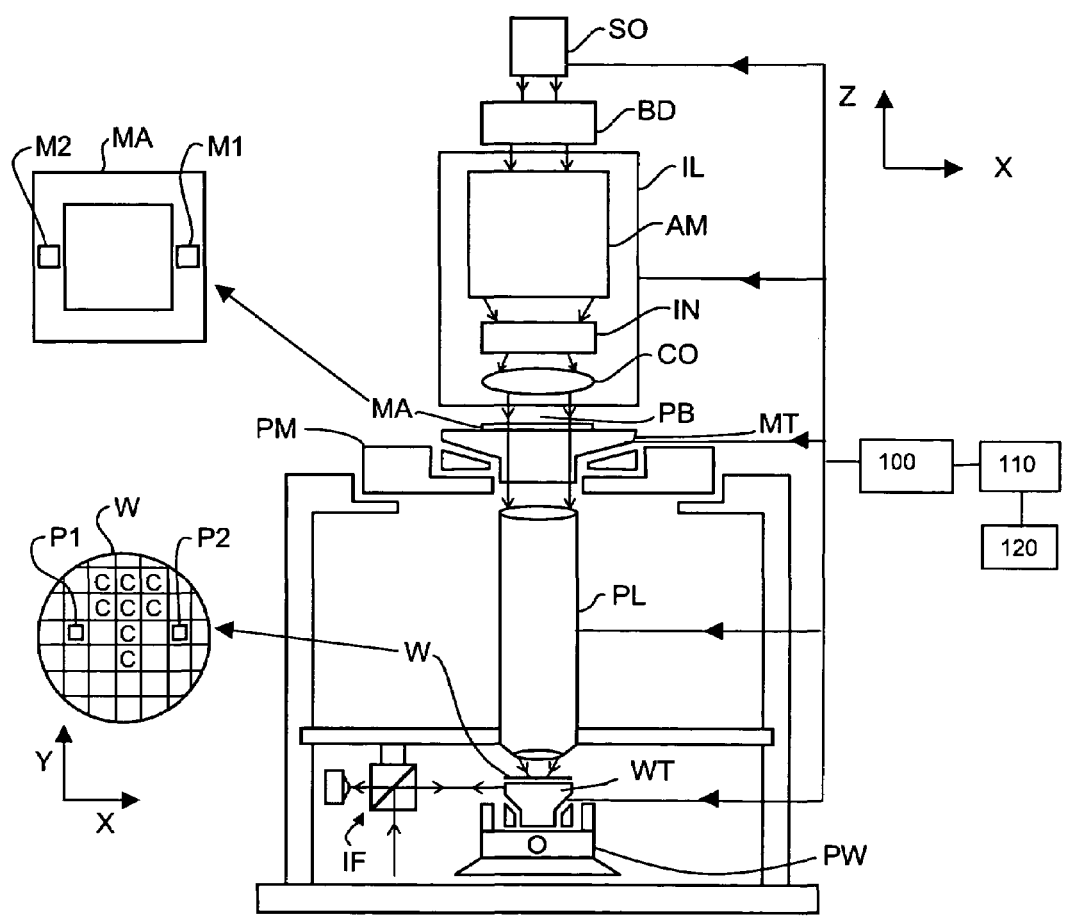
FIG. 1 depicts a lithographic apparatus according to an embodiment of the invention.

FIG. 1 schematically depicts a lithographic apparatus whereby the method according to a particular embodiment of the invention can be used. The apparatus comprises:

- an illumination system (illuminator) IL for providing a projection beam PB of radiation (e.g. UV radiation or DUV radiation of a wavelength of less than about 270 nm, such as wavelengths of 248, 193, 157, and 126 nm, or radiation generated by a laser-fired plasma source operating at 13,6 nm wavelength).
- a first support structure (e.g. a mask table) MT for supporting a patterning device (e.g. a mask) MA and connected to first positioner PM for accurately positioning the patterning device with respect to item PL;
- a substrate table (e.g. a wafer table) WT for holding a substrate (e.g. a resist-coated wafer) W and connected to second positioner PW for accurately positioning the substrate with respect to item PL; and
- a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X- and/or Y-direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and scanning direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus comprises a controller 100 for providing signals to the apparatus or any of its modules in response to which apparatus parameter-settings are adjusted and/or changed. Parameter-settings which are controlled are for example the NA of an adjustable NA-diaphragm provided in a pupil of the projection system PL, the settings of the illumination system IL (such as, for example, the σ-outer and σ-inner settings), the exposure dose setting, the position of the substrate table WT along the Z-axis, the position of the mask table MT along the Z-axis, the tilt of the substrate table WT with respect to the Z-axis (and similarly of the mask table MT), and the position and orientation of adjustable lens elements of the projection system PL). The latter apparatus parameter-settings can be used to control and adjust optical aberrations of the projection system PL; it is known that an iso-dense bias characteristic depends on optical aberrations and their relative magnitudes. The controller comprises a computer which is used to calculate, from input data 120, the value of apparatus parameter-settings required for obtaining a desired iso-dense bias characteristic. The calculation may involve a simulation of the lithographic process to predict CD values as a function of pitch, based on any data relevant for the simulation such as, for example, data relating to the apparatus, data concerning the pattern to be projected and printed, and data concerning the resist in use. Said data, represented by the box 120 in FIG. 1, are stored in a memory device 110, which may be part of the controller 100 and which is readable/addressable by the computer. For matching of an iso-dense bias characteristic to a target iso-dense bias characteristic, the data 120 comprise data representing said target iso-dense bias characteristic. The controller calculates a difference between the target iso-dense bias characteristic and the iso-dense bias characteristic for the lithographic process to be executed using the lithographic apparatus, and may use any minimization algorithm to minimize this difference by adjusting one or more apparatus parameter-settings. In particular, parameter-settings controlling the position of the substrate table WT relative to an image plane of the projection system PL can be used for such a minimization, but in principle any combination of parameter-settings (such as, for example, said parameter settings in combination with parameter-settings controlling σ-settings) can be used for minimization.

Figure 2:
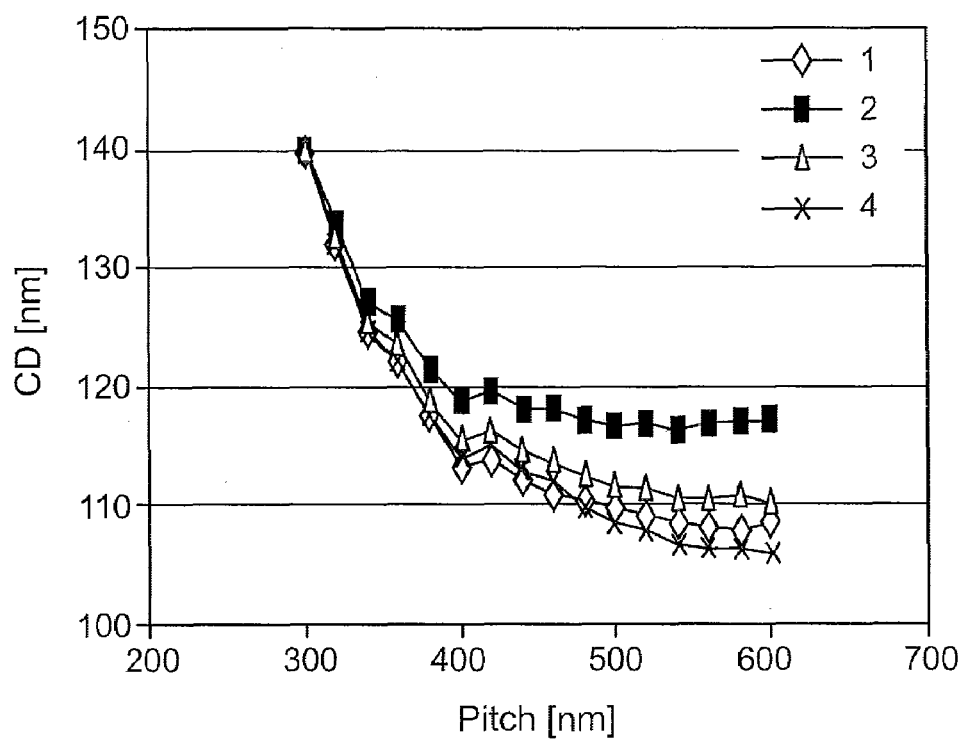
FIG. 2 shows iso-dense bias characteristics for different settings of an illumination system.
Figure 3:
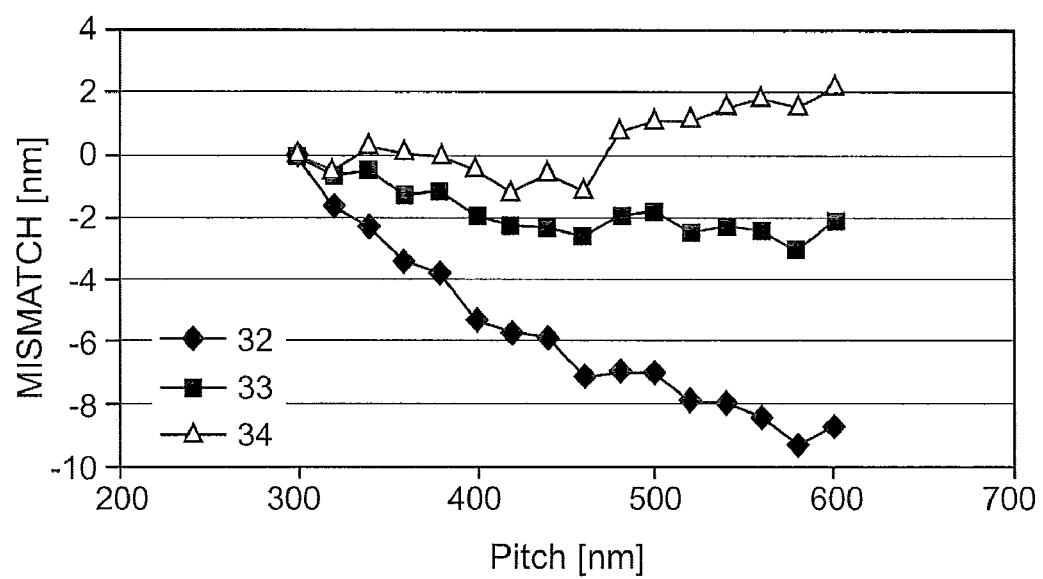
FIG. 3 illustrates residual mismatch of iso-dense bias for different settings of an illumination system.
Figure 4:
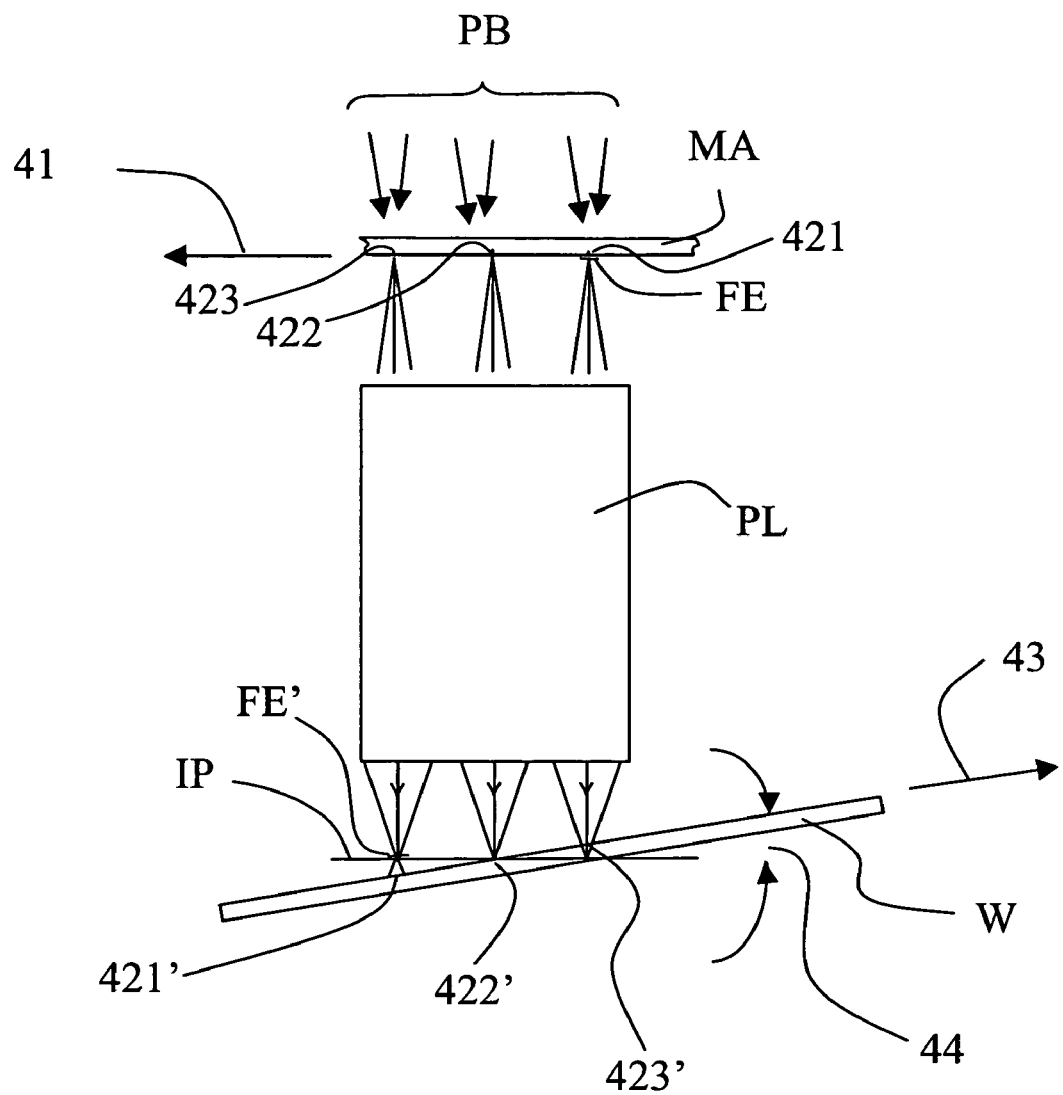
FIG. 4 schematically illustrates a scheme for introducing contrast loss using a scanner.
Figure 5:
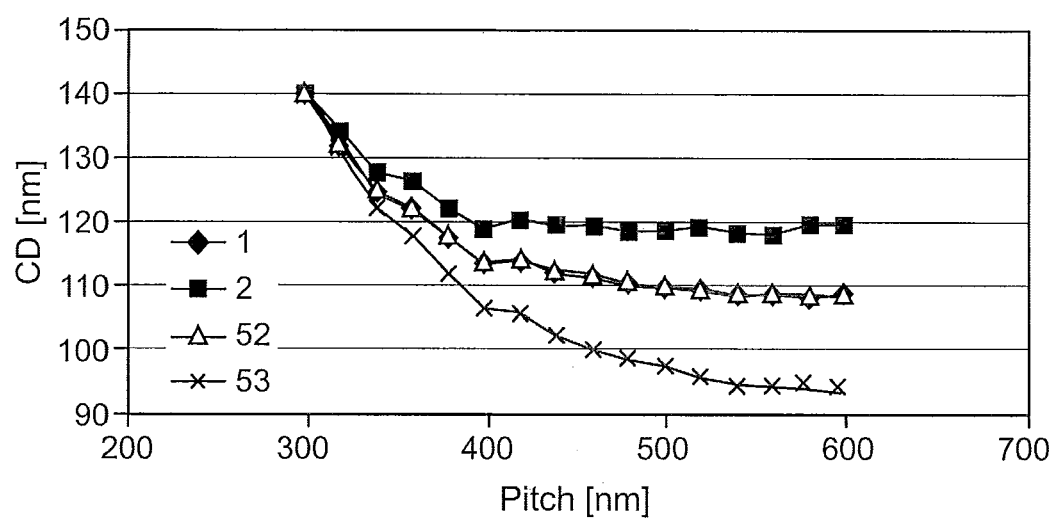
FIG. 5 shows iso-dense bias characteristics for different settings of contrast-loss.
Figure 6:
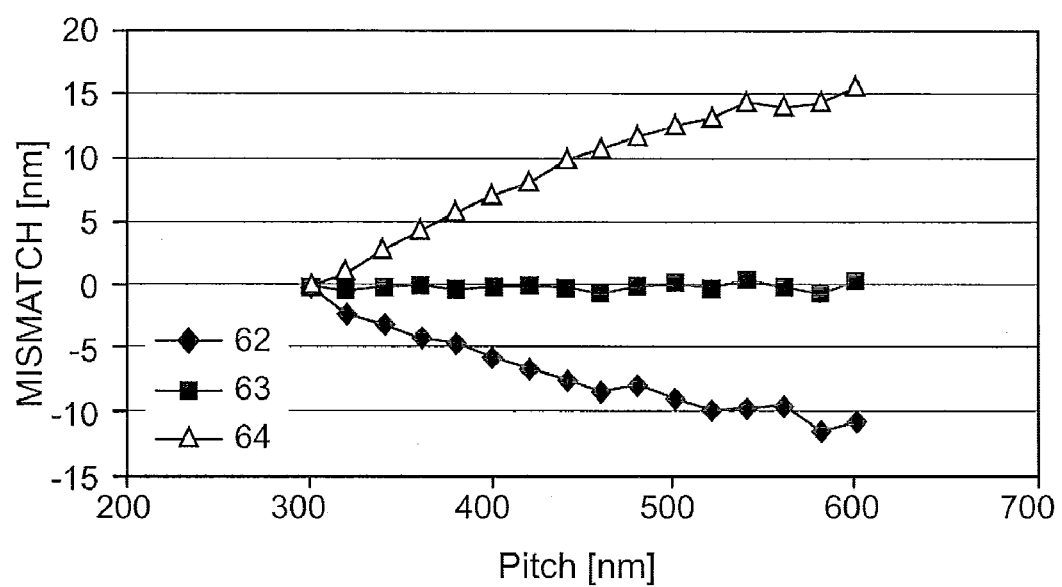
FIG. 6 illustrates residual mismatch of iso-dense bias for different settings of contrast loss.

In the present embodiment of the method, a given lithographic process for printing a pattern comprising features with a CD of 130 nm, disposed in the pattern at pitches ranging from 300 nm up to 600 nm, is run on two different apparatus. On both machines, the σ-settings were initially chosen to be σ-inner=0.55 and σ-outer=0.85. One lithographic projection apparatus is a NA=0.75 system, coupled to an 193 nm wavelength, 1.3 pm bandwidth excimer laser. The other, "high-end" lithographic projection apparatus is a NA=0.85 system, coupled to a 193 nm wavelength, 0.8 pm bandwidth excimer laser. FIG. 1 schematically represents this high-end system, and this system is to be iso-dense bias matched to the NA=0.75 system for the given lithographic process. The two apparatus feature two different iso-dense bias characteristics, as is illustrated in FIG. 2. Graph 1 in FIG. 2 represent the iso-dense bias characteristic for the lithographic process when run on the NA=0.75 system, and the data describing CD as function of pitch for this graph represent the target iso-dense bias characteristic. Graph 2 in FIG. 2 represents the iso-dense bias characteristic for the lithographic process when run on the high-end, NA=0.85 apparatus. For increasing pitch the match of the iso-dense bias characteristics is decreasing; at 600 nm pitch the difference in CD is about 10 nm. With the iso-dense bias graph 1 as the target iso-dense bias characteristic, application of a change of σ-inner and outer setting to the high-end system resulted in iso-dense bias characteristics 3 and 4 in FIG. 2, obtained respectively with σ-inner=0.59, σ-outer=0.89 and σ-inner=0.63, σ-outer=0.93 settings. In FIG. 3 the graph 32 shows the initial mismatch (before applying the σ-setting changes to the high-end system) between the two systems, and the graphs 33, and 34 show the residual mismatch of the iso-dense bias characteristics 3 and 4 with the target iso-dense bias characteristic 1, respectively. There is the problem that there is a non-vanishing through-pitch mismatch of up to approximately 3 nm for isolated pitches. The inventors found that the spectral distribution of radiation energy in the projection beam is a critical parameter for an iso-dense bias characteristic. The difference in bandwidth of the laser beam spectral peak for the high-end system and the NA=0.75 system is the main contributor to the mismatch of iso-dense bias characteristics 1 and 2. The present invention is based on the insight that the phenomenon of contrast loss in the image due to finite laser bandwidth can be mimicked by introducing, after starting an exposure and before completing an exposure, a change of the distance along the Z-direction, see FIG. 1, between an image of at least a part of the pattern at said notional image surface and a corresponding image at the target portion of the substrate. The Z-direction in the present embodiment is parallel to an optical axis of the projection system PL, and is (substantially) perpendicular to the notional image surface of the projection lens. The change of said distance along the Z-direction leads to a controlled contrast loss in the image of the pattern as obtained upon completing the exposure of the resist layer. By creating a pattern image in such a manner a matching of iso-dense bias characteristics is possible. FIG. 4 schematically illustrates a scheme for creating controlled contrast loss in the image of the pattern. A part FE of the pattern on the mask MA is imaged as a pattern FE' at the notional image surface IP. The part FE may comprise a group of features of the pattern, and it is to be projected on the substrate W by using a step-and-scan lithographic projection apparatus. The mask MA is scanning, during exposure of a radiation sensitive layer on top of the substrate W, in a direction 41. The wafer W is scanned in a direction 43. Initially the feature group FE is at position 421 with respect to the projection lens PL. During the scan, the feature group FE traverses the positions 422 and 423 respectively. In any of these positions it is illuminated by the projection beam PB. A pattern at positions 421, 422 and 423 is projected onto the target area at the positions 421', 422', and 423' respectively. The wafer W, supported by the substrate table (not shown), and the mask MA, supported by the mask table MT (not shown) are scanned synchronously as explained above so that the exposures at positions 421', 422' and 423' add up to a single dynamic exposure. The scanning direction of the substrate table is slightly tilted, about an axis perpendicular to the scanning direction 43, over an angle 44 with respect to the best focus image plane IP. As a consequence, during exposure the distance, along a Z-direction substantially perpendicular to the image plane IP, between the image FE' (at the image plane IP) of the part FE of the pattern and the corresponding image at the target portion of the substrate is changed from a finite value at position 421' to about zero at position 422' to again a finite value at position 423'. Once the exposure of the part of the pattern FE is completed, a controlled, integrated loss of contrast in the resulting single dynamic exposure of FE is obtained. Similarly any other part of the pattern is subjected to the same controlled loss of contrast during projection and exposure. As a result, the iso-dense bias characteristic for the lithographic process using the pattern of which FE is a part and run on the lithographic apparatus, is adjusted. The result of adjusting the iso-dense bias characteristic of the high-end apparatus according to the present embodiment is shown in FIG. 5. Graph 1 (the iso-dense bias characteristic of the NA=0.75 system) is practically hidden behind graph 52, which is the iso-dense bias characteristic for the high end apparatus, operating at the same σ-settings as the NA=0.75 system, and where the scanning direction 43 is tilted 48 microradian with respect to the image plane IP. For reference the original iso-dense bias characteristic 2 for zero tilt of the substrate table holding the substrate is shown as well. Similarly, the graph 53 show the iso-dense bias characteristic for a tilt of the scan direction of 78 microradian, which for the present case would be an over correction, but which clearly shows the extreme effectiveness of the method. FIG. 6 shows the residual mismatch of iso-dense bias characteristics. Graph 62 serves for reference and represents the mismatch between the lithographic processes when run on the NA=0.85 and the NA=0.75 respectively, in the absence of any iso-dense bias matching. Graph 63 shows the residual mismatch for the present embodiment associated with the iso-dense bias characteristic obtained through 48 microradian tilt of the substrate scanning direction, as explained above.

FIG. 6 clearly illustrates the importance of the present invention. The pitch dependency of graph 63 in FIG. 6 is smaller and smoother than the pitch dependency of graph 33 in FIG. 3; thus, iso-dense bias matching using controlled contrast loss, as explained above, is useable instead of using σ-settings, With the method according to the invention, the residual mismatch is strongly reduced with respect to the mismatches shown in FIG. 3. An improvement of matching by a factor 3 is demonstrated with the present embodiment. Any residual mismatch in the present embodiment is of the order of 1 nm, as illustrated by graph 63 in FIG. 6. Graph 64 shows the above mentioned "overcorrected" matching for 75 microradian tilt of the substrate scanning direction. A further important advantage of the method according to the present embodiment is that the tilt angle 44 is sufficiently small such as to not have any significant effect on process window. In particular, there are no effects on exposure latitude. Since the present invention addresses and exploits preferably induced contrast- or NILS-loss of images used for exposure that occur within a range of defocus up to about the operational depth of focus (for example 300 nm above and below a surface of best focus), the latter advantage is not limited to the present embodiment, but is characteristic of the invention in any of its embodiments.

Figure 7:
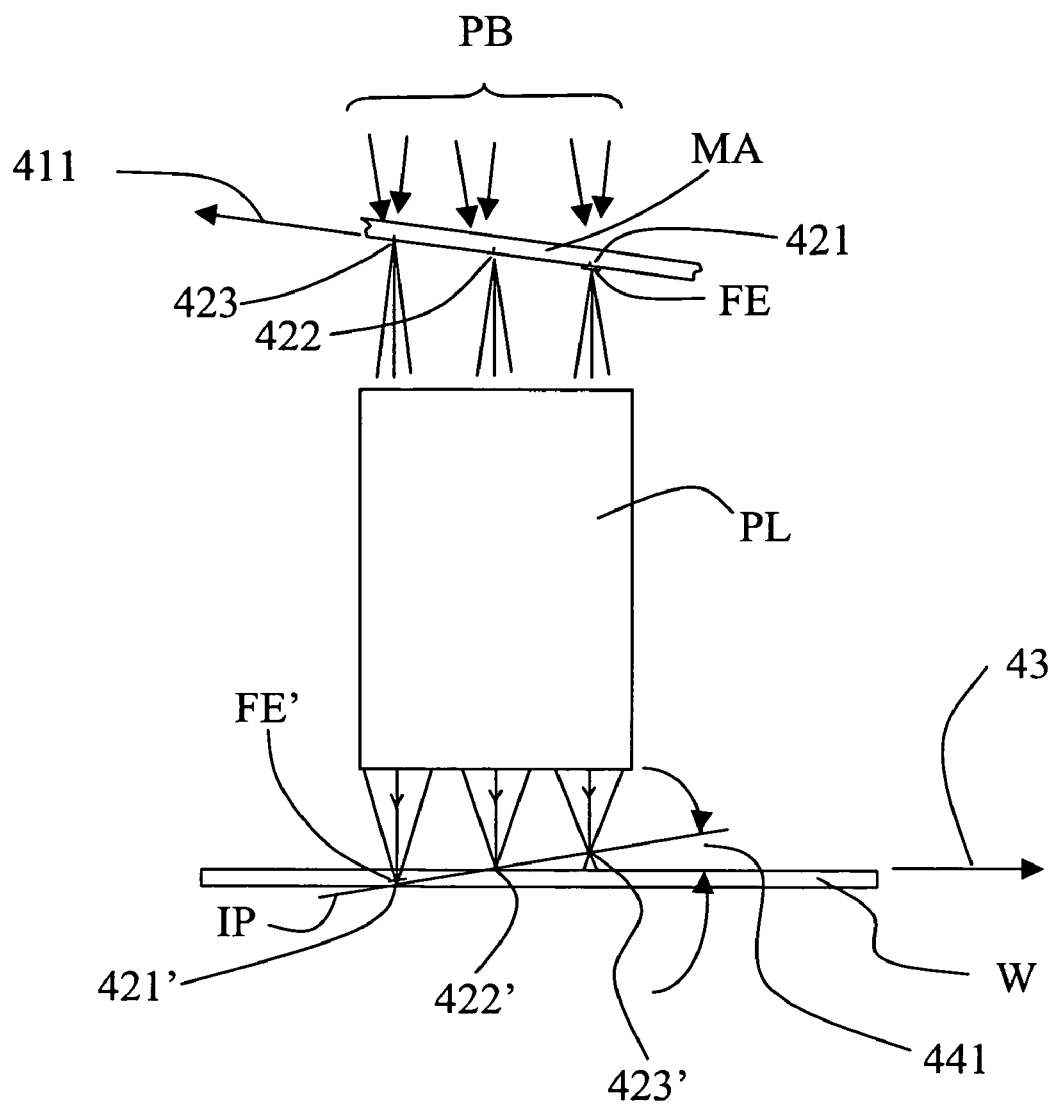
FIG. 7 schematically illustrates an alternative scheme for introducing contrast loss using a scanner.

An alternative version of the present embodiment of the method (whereby, as above, the lithographic projection apparatus is a step-and-scan apparatus) comprises inducing a tilt of said notional image surface in the scanning direction for the changing of a distance along a Z-direction during scanning exposure of the target portion by tilting the patterning device and the scanning direction of the patterning device. This is illustrated in FIG. 7, where said induced tilt is indicated by the angle 441. The notional image surface IP is a surface of best focus associated (through imaging) to the pattern on the tilted mask MA, as schematically indicated in FIG. 7. The tilted mask is movable in a tilted direction 411 parallel to the mask surface carrying the pattern. The relation between the tilt of the mask MA and the corresponding induced tilt 441 of the notional image plane IP is to first approximation given by the Scheimpflug condition.

Embodiment 2

Figure 8:
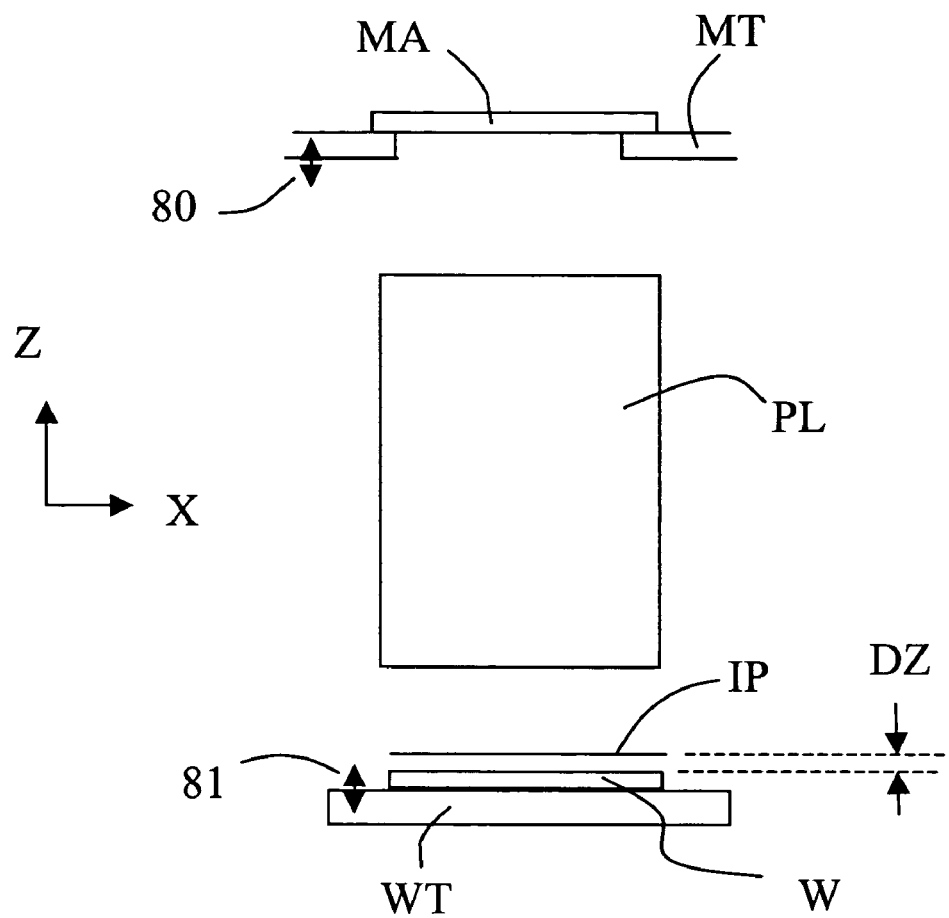
FIG. 8 illustrates displacements with respect to the projection system, during exposure of the target area, of the substrate table and the support structure, and FIG. 9 schematically shows a distribution of distances DZ, as experienced by each part of an exposed target portion integrated over an exposure.

According to an embodiment of the invention, and as illustrated in FIG. 8, the extra degree of freedom to manipulate an iso-dense bias characteristic can be provided by applying a displacement along the Z-direction, schematically indicated by the arrow 81 in FIG. 8, with respect to the projection system PL, during exposure of the target area, to the substrate table WT holding a substrate W. The displacement 81 is substantially perpendicular to an image surface of the projection system PL, and provides an induced contrast loss as a result of a defocus. The defocus is a result of a change of the position of an image plane of the projection system relative to a surface comprising a target portion on the substrate W whereby said image plane is optically conjugate to a surface comprising the mask pattern on the mask MA. This change of position effectuates said distance (as mentioned under embodiment 1) along the Z-direction between an image of at least a part of the pattern at said notional image surface IP and a corresponding image at the target portion of the substrate. The latter distance is referred to hereinafter as DZ.

Similarly, as an alternative, a displacement along the Z-direction, schematically indicated by the arrow 80 in FIG. 8, can be applied to the support structure MT supporting the patterning device MA.

Alternatively, both the substrate table W and the support structure MT can be arranged such that they are displaceable along the Z-direction, and displacements 80 and 81 parallel to the Z-direction can be selected in such a manner that the surfaces comprising the mask pattern and the target portion respectively are not exactly optically conjugate to each other (so that a defocus, and hence, a loss of contrast is induced).

Figure 9:
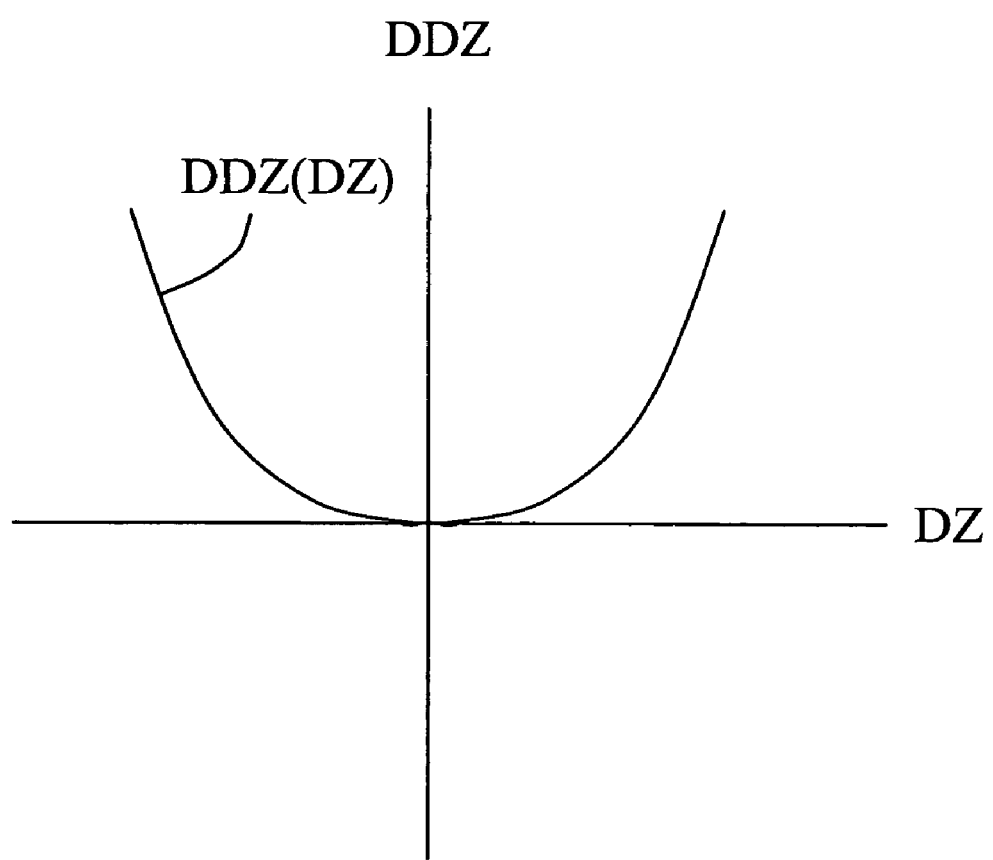

Said displacements 80 and/or 81 can be embodied as a, during exposure, continuous movement in accordance with a preselected time dependence (during exposure) of the distance DZ expressed as DZ=DZ(t) where t represents time. For example, a cyclic movement (a vibration) along the Z-direction of the substrate holder results in a corresponding cyclic time dependence of DZ as a function of time, DZ(t). The choice of the exact cyclic shape of the movement (for example, a movement in accordance with a sinusoidal, or triangular function of time), determines the distribution of distances DZ, as experienced by each part of the exposed target portion integrated over an exposure. This distribution of distances DZ is denoted by DDZ, and DDZ is a function of the value DZ. DDZ is a measure for the integrated exposure energy delivered to the target portion for each value of DZ. DDZ varies as a function of DZ in accordance with the derivative with respect to DZ of the function t(DZ) which is obtained by inverting DZ(t). Said derivative is denoted as t'(DZ), and consequently t'(DZ) is representative for a "shape" of the distribution DDZ(DZ). A particular shape of DDZ(DZ) affects the resulting average loss of contrast in a corresponding way, and the shape may therefore be used as a design parameter or control parameter to adjust said loss of contrast (and hence, to adjust a resulting iso-dense bias characteristic). For example, a movement in accordance with a sinusoidal function of time results in a one over square root like shape of DDZ characterized by the function $1/\sqrt{1-DZ^2}$, as schematically indicated in FIG. 9.

Alternatively, said changing a distance along a Z-direction can be arranged at a rate of change which is constant during exposure, resulting—as in embodiment 1—in a uniform distribution DDZ(DZ). For example, a saw tooth shape of the movement can be embodied. In case of the use of a pulsed laser as radiation source, an intermittent movement can be used, and the displacement can be done either between the pulses or during exposure to one or more pulses of radiation, or at both instances. With this type of movement, a positioning of the substrate at a plurality of subsequent positions can be arranged in accordance with a preselected distribution of Z-positions. For example, the selection can be chosen to effectively realize a Gaussian distribution DDZ(DZ), again using the type of distribution as a design parameter or control parameter to adjust a resulting iso dense bias characteristic.

Embodiment 3

Embodiment 3 is the same as embodiment 2 whereby during exposure of the target area, the substrate table holding a resist coated substrate, and/or the support structure supporting the patterning device, is moved along the Z-direction and whereby the displacement is a cyclic movement (a vibration), safe for the fact that this embodiment is suitable in particular for step and scan apparatus. In general, the exposure energy at substrate level, as experienced by a point in the target portion, is not constant during exposure. It may in scan direction vary due to shadow effects produced by the illumination system, and due to the pulsing of laser radiation. Therefore, the cyclic changing of said distance shall, for example, include a plurality of cycles during scanning exposure of the target portion so that different points on a line in the scanning direction in the target portion experience, on the average, the same integrated exposure energy as a function of DZ. As a consequence, improved uniformity of average contrast loss in the scanning direction is obtained, and hence improved control of iso-dense bias characteristic is obtained.

While specific embodiments of the invention have been described above, it will be appreciated that the invention may be practiced otherwise than as described. The description is not intended to limit the invention.

What is claimed is:

1. A method for exposing a substrate that is at least partially covered by a radiation sensitive layer, using a lithographic projection apparatus comprising:
   exposing a target portion of the substrate with a pattern; and
   after starting exposure and before completing exposure of the target portion, inducing a loss of contrast for said pattern to modify an iso-dense bias characteristic by introducing a defocus within the depth of focus for the image of the pattern.

2. A method according to claim 1, wherein said inducing a loss of contrast for said pattern comprises changing a distance, along a Z-direction substantially perpendicular to a notional image surface of a projection system of the lithographic projection apparatus, between an image of the pattern and a corresponding image at said notional image surface.

3. A method according to claim 2, wherein said changing a distance along a Z-direction comprises changing a position of the substrate along the Z-direction.

4. A method according to claim 2, wherein said changing a distance along a Z-direction comprises changing a position of a patterning device along the Z-direction, the patterning device configured to impart the pattern to a radiation beam.

5. A method according to claim 2, wherein said changing a distance along a Z-direction comprises a cyclic changing of said distance.

6. A method according to claim 2, wherein said changing a distance along a Z-direction comprises a rate of change which is constant.

7. A method according to claim 2, wherein said changing a distance along a Z-direction comprises an intermittent movement.

8. A method according to claim 7, wherein said changing a distance comprises positioning the substrate in accordance with a Gaussian distribution of Z-positions.

9. A method according to claim 2, wherein the lithographic projection apparatus is a step-and-scan apparatus wherein said substrate is movable along a scanning direction, and wherein said changing a distance along a Z-direction comprises tilting said scanning direction and said target portion with respect to the notional image surface around an axis substantially parallel to the notional image surface.

10. A method according to claim 2, wherein the lithographic projection apparatus is a step-and-scan apparatus wherein said substrate is movable along a scanning direction, and wherein said changing a distance along a Z-direction is a cyclic changing of said distance which comprises a plurality of cycles during scanning exposure of the target portion to provide improved uniformity of average contrast loss in the scanning direction.

11. A method according to claim 2, wherein the lithographic projection apparatus comprises a step-and-scan apparatus wherein a patterning device configured to impart the pattern to a radiation beam is movable along a scanning direction, and wherein said changing a distance along a Z-direction comprises tilting the patterning device and the scanning direction of the patterning device to induce a tilt of said notional image surface.

12. A method according to claim 1 further comprising:
   reducing a difference between the iso-dense bias characteristic and a target iso-dense bias characteristic.

13. A method according to claim 2 wherein said changing a distance comprises a change of distance between about 20 nm and about 50 nm.

14. A method according to claim 2, wherein said changing a distance comprises a change of distance less than or equal to 300 nm.

15. A method for exposing a substrate that is at least partially covered by a radiation sensitive layer, using a lithographic projection apparatus comprising:
   exposing a target portion of the substrate with a pattern; and
   during exposing of the target portion, changing a distance, along a Z-direction substantially perpendicular to a notional image surface of a projection system of the lithographic projection apparatus, between an image of the pattern and a corresponding image at said notional image surface within the depth of focus for the image of the pattern.

16. A method according to claim 15, wherein the depth of focus is less than or equal to 300 nm and said changing a distance comprises a change of distance less than or equal to 300 nm.

17. A method according to claim 16, wherein said changing a distance comprises a change of distance less than or equal to about 50 nm.

18. A method according to claim 16, wherein said substrate is movable along a direction, and wherein said changing of a distance comprises tilting said direction and said substrate with respect to the notional image surface.

19. A method according to claim 15, further comprising:
   storing data representing a target iso-dense bias characteristic and an iso-dense bias characteristic representative for a process run on the lithographic projection apparatus;
   determining, based on said data, one or more apparatus parameter-setting changes; and
   applying said one or more apparatus parameter-setting changes, wherein said one or more apparatus parameter-setting changes comprise:
   (a) a change of position of a substrate table supporting the substrate with respect to a notional image surface of a projection system of the lithographic projection apparatus along a Z-direction substantially perpendicular to said notional image surface; and/or (b) a change of rotational orientation of the substrate table around an axis substantially parallel to said notional image surface and substantially perpendicular to a scanning direction.

20. A method according to claim 19, comprising storing data representing a plurality of target iso-dense bias characteristics, and further comprising selecting through a user interface one of said plurality of target iso-dense bias characteristics for use in determining said apparatus parameter-setting changes and applying said one or more apparatus parameter-setting changes.

21. A method according to claim 15, wherein said changing a distance comprises changing a position of a patterning device along the Z-direction, the patterning device configured to impart the pattern to a radiation beam.

22. A method according to claim 15, wherein said changing a distance comprises a cyclic change of the distance.

23. A method according to claim 15, wherein said changing a distance comprises a rate of change which is constant.

24. A method according to claim 15, wherein said changing a distance comprises an intermittent movement.

25. A method according to claim 15, wherein said substrate is movable along a direction, and wherein said changing a distance comprises tilting said direction and said substrate with respect to the notional image surface.

26. A method according to claim 15, wherein the lithographic projection apparatus is a step-and-scan apparatus wherein said substrate is movable along a scanning direction, and wherein said changing a distance is a cyclic change which comprises a plurality of cycles during scanning exposure of the substrate to provide improved uniformity of average contrast loss in the scanning direction.

27. A method according to claim 15, wherein the lithographic projection apparatus comprises a step-and-scan apparatus wherein a patterning device configured to impart the pattern to a radiation beam is movable along a scanning direction, and wherein said changing a distance comprises tilting the patterning device and the scanning direction of the patterning device to induce a tilt of said notional image surface.

28. A method according to claim 15, comprising reducing a difference between the iso-dense bias characteristic and a target iso-dense bias characteristic.

29. A method according to claim 16, wherein said changing a distance comprises changing a position of the substrate along the Z-direction.

* * * * *